(12) United States Patent  
Dai et al.

(10) Patent No.: US 9,614,368 B2  
(45) Date of Patent: Apr. 4, 2017

(54) AREA-EFFICIENT ACTIVE-FET ESD PROTECTION CIRCUIT

(71) Applicant: TEXAS INSTRUMENTS INCORPORATED, Dallas, TX (US)

(72) Inventors: Xianzhi Dai, Shanghai (CN); Farzan Farbiz, Dallas, TX (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 14/618,825

(22) Filed: Feb. 10, 2015

(65) Prior Publication Data

US 2016/0233668 A1 Aug. 11, 2016

(51) Int. Cl.
*H02H 9/04* (2006.01)

(52) U.S. Cl.
CPC .................... *H02H 9/046* (2013.01)

(58) Field of Classification Search
CPC ........................................ H02H 9/04
USPC ......................................... 361/56
See application file for complete search history.

(56) References Cited

U.S. PATENT DOCUMENTS

| 6,624,992 | B1 * | 9/2003 | Aparin | H02H 9/046 361/56 |
| 7,286,331 | B2 * | 10/2007 | Choi | H01L 27/0266 361/111 |
| 7,821,752 | B2 * | 10/2010 | Choi | H02H 9/046 361/56 |
| 8,093,623 | B2 * | 1/2012 | Mawatari | H01L 27/0259 257/173 |

* cited by examiner

*Primary Examiner* — Scott Bauer
(74) *Attorney, Agent, or Firm* — Tuenlap D. Chan; Charles A. Brill; Frank D. Cimino

(57) ABSTRACT

An electrostatic discharge (ESD) protection circuit includes a high power supply rail (VDD) and a low power supply rail (VSS). The ESD protection circuit further includes an active shunt transistor coupled between VDD and VSS. The active shunt transistor includes a gate. The ESD protection circuit also includes a sensing transistor connected between an input/output (I/O) pad and the gate of the active shunt transistor. If an ESD stress event occurs on the I/O pad or on a VDD pad, the sensing transistor is caused to be turned ON thereby permitting a voltage on the I/O or VDD pad experiencing the ESD stress event to turn ON the active shunt transistor in turn causing ESD current to flow from the pad experiencing the ESD event, through VDD, and through the active shunt transistor to VSS.

8 Claims, 3 Drawing Sheets

AREA-EFFICIENT ACTIVE-FET ESD PROTECTION CIRCUIT

CROSS-REFERENCE TO RELATED APPLICATIONS

Not Applicable.

BACKGROUND

Modern high-density integrated circuits (ICs) are known to be vulnerable to damage from the electrostatic discharge (ESD) from a charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or during runtime of the system in which the IC is installed. Some ESD protection schemes use active clamp circuits to shunt ESD current between the power supply rails and thereby protect internal IC element nodes that are connected to bond pads from ESD damage. An active clamp circuit may include a Metal Oxide Semiconductor Field Effect Transistor (MOSFET) coupled between the power supply rails. This MOSFET is relatively large and often occupies 60% or more of total area of the ESD protection circuit. Each of the IC's pins generally includes its own ESD protection circuit with its own large MOSFET.

SUMMARY

An electrostatic discharge (ESD) protection circuit includes a high power supply rail (VDD) and a low power supply rail (VSS). The ESD protection circuit further includes an active shunt transistor coupled between VDD and VSS. The active shunt transistor includes a gate. The ESD protection circuit also includes a sensing transistor connected between an input/output (I/O) pad and the gate of the active shunt transistor. If an ESD stress event occurs on the I/O pad or on a VDD pad, the sensing transistor is caused to be turned ON thereby permitting a voltage on the I/O or VDD pad experiencing the ESD stress event to turn ON the active shunt transistor in turn causing ESD current to flow from the pad experiencing the ESD event, through VDD, and through the active shunt transistor to VSS.

In yet another embodiment, an integrated circuit (IC) comprises host logic, and a plurality of input/output (I/O) pads connected to the host logic and providing input and output connections for the host logic. For each I/O pad, an electrostatic discharge (ESD) protection circuit is provided that includes a high power supply rail (VDD) and a low power supply rail (VSS). The ESD protection circuit also includes, an active shunt transistor coupled between VDD and VSS. The active shunt transistor includes a gate. The ESD protection circuit further includes a sensing transistor connected between the corresponding I/O pad and the gate of the active shunt transistor. If an ESD stress event occurs on the I/O pad, the sensing transistor is caused to be turned ON thereby permitting a voltage on the I/O pad to turn ON the active shunt transistor in turn causing ESD current to flow from VDD through the active shunt transistor to VSS.

In yet another embodiment, an electrostatic discharge (ESD) protection circuit includes a high power supply rail (VDD) and a low power supply rail (VSS), an active shunt transistor coupled between VDD and VSS, and a sensing transistor. The active shunt transistor includes a gate. The sensing transistor is connected between an input/output (I/O) pad and the gate of the active shunt transistor. If an ESD stress event occurs on the I/O pad, the sensing transistor is caused to be turned ON thereby causing a voltage on the I/O pad experiencing the ESD stress event to turn ON the active shunt transistor in turn causing ESD current to flow from the pad experiencing the ESD event, through VDD, and through the active shunt transistor to VSS. Further, if an ESD stress event occurs on a VDD pad, the sensing transistor is caused to be turned ON thereby causing a voltage on the VDD pad experiencing the ESD stress event to turn ON the active shunt transistor in turn causing ESD current to flow from the VDD pad through the active shunt transistor to VSS.

BRIEF DESCRIPTION OF THE DRAWINGS

For a detailed description of various illustrative implementations, reference will now be made to the accompanying drawings in which.

DETAILED DESCRIPTION

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct electrical connection or through an indirect electrical connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are described herein of an ESD protection circuit in which the large transistor that shunts ESD current between the power rails is physically smaller than might otherwise be the case. The transistor that shunts the current (referred to herein as the "active shunt transistor") is activated by a larger gate voltage than would otherwise be the case because the input/output (I/O) pad and/or VDD pad being protected by the ESD protection circuit is generally connected directly to the gate of the active shunt transistor with very little voltage drop. Because the gate voltage to turn ON the active shunt transistor is larger than in other ESD protection circuits, a smaller area transistor can be employed as the shunt transistor thereby reducing the overall size of the ESD protection circuit itself.

Figure 1:
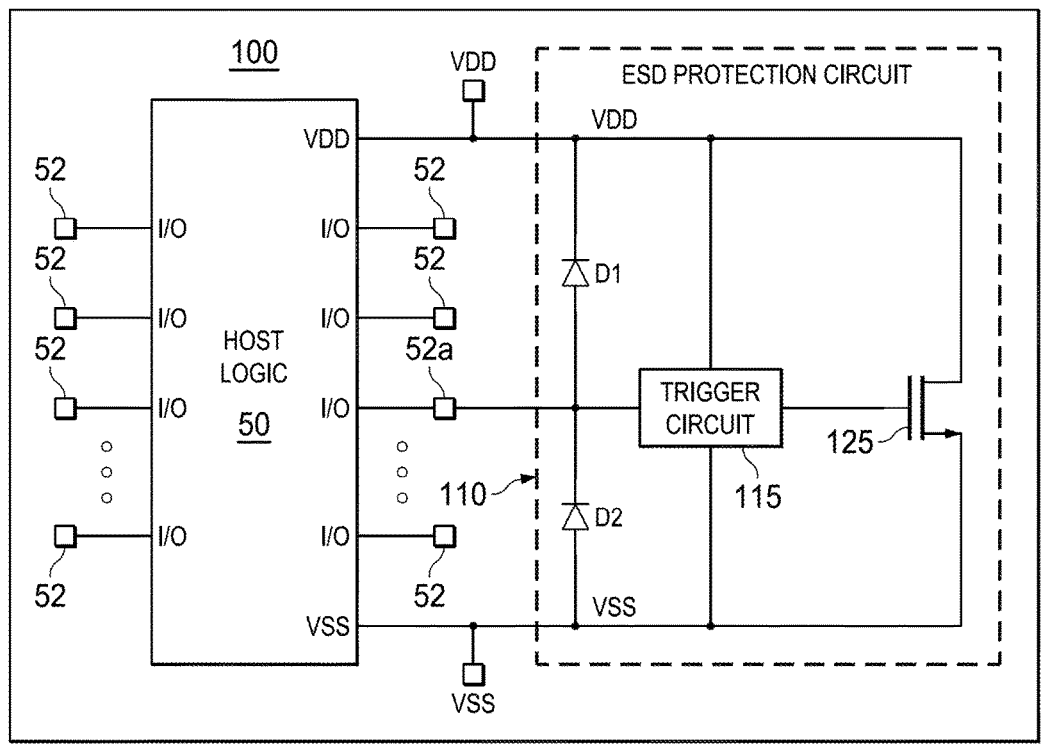
FIG. 1 is a schematic diagram of an ESD-protected IC including a triggering circuit in accordance with various embodiments.

FIG. 1 is a schematic diagram of an example of an ESD-protected IC 100. The IC 100 includes host logic 50 which includes at least one, and generally multiple I/O pads 52. The I/O pads 52 provide the host logic 50 of the IC 100 with I/O connectivity to other ICs and devices. An ESD protection circuit 110 is provided for at least one and, in some implementations, all I/O pads 52. An example of one of the ESD protection circuits 110 is illustrated for the I/O pad designated as I/O pad 52a, and the remaining ESD protection circuits for the other I/O pads 52 are not shown in FIG. 1 for simplicity.

The host logic 50 is connected by a VDD pad to VDD and by a VSS pad to VSs and includes multiple I/O pads 52 by which the host logic 50 carries out its function. Host logic 50 receives signals from and transmits signals to the various I/O pads 52. The host logic 50 realizes and caries out desired functionality of ESD-protected IC 100. Examples of such host logic functionality include a digital IC such as a digital signal processor or microcontroller, an analog IC such as an amplifier or power converter, etc. The capability of the host logic 50 provided by the ESD-protected IC 100 may vary, for example, ranging from a simple device to a complex device.

The ESD protection circuit 110 includes a pair of diodes D1 and D2, a trigger circuit 115 and an active shunt transistor 125. Diode D1 connects between the I/O pad 52a and VDD, while diode D1 connects between the I/O pad 52a and VSS. The active shunt transistor 125 connects between VDD and VSS with its drain connected to VDD and its source connected to VSS. The trigger circuit 115 drives the gate of the active shunt transistor 125 in response to an elevated voltage on the I/O pad 52a resulting from an ESD stress event on the I/O pad. The ESD protection circuit 110 of FIG. 1 does not also protect the VDD pad from an ESD stress event, but other embodiments disclosed herein do provide ESD protection for the VDD pad.

The components of the ESD-protected IC 100 shown in FIG. 1 are formed on a substrate. In some implementations, the substrate may comprise silicon, silicon-germanium, or other semiconductor material. In one example, the substrate is a p– epi on a p+ substrate. Another particular arrangement is a silicon/germanium (SiGe) semiconductor surface on a silicon substrate.

In operation, an ESD stress event on I/O pad 52a creates an elevated voltage (with respect to VSS) that is higher than VDD and that will turn ON diode D1. In turn, the trigger circuit 115 responds by asserting the gate of the active shunt transistor 125. Once ON, the active shunt transistor 125 effectively shorts VDD to VSS thereby permitting a current path from VDD to VSS. The current path through the active shunt transistor 125 during an ESD stress event enables the ESD-based current to shunt directly to ground through the active shunt transistor 125 rather than through the host logic 50, which otherwise might damage the host logic. Thus, with the active shunt transistor 125 ON during an ESD stress event on the I/O pad 52a, current is conducted from the I/O pad, through diode D1, the VDD rail and through the active shunt transistor 125 to VSS.

Figure 2:
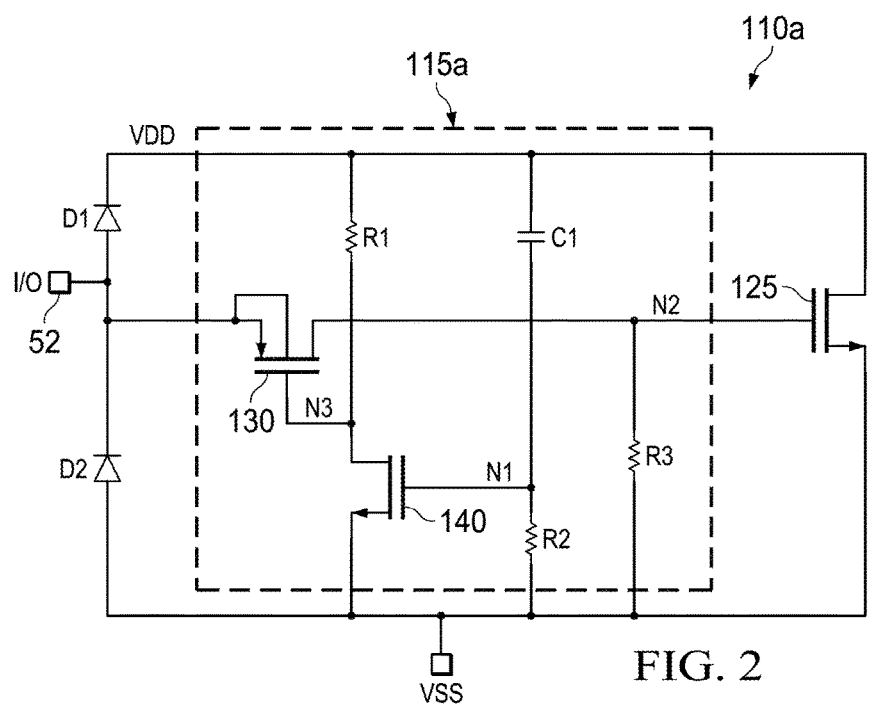
FIG. 2 shows an example of a triggering circuit which provides ESD protection for an input/output (I/O) pad in accordance with various embodiments.
Figure 3:
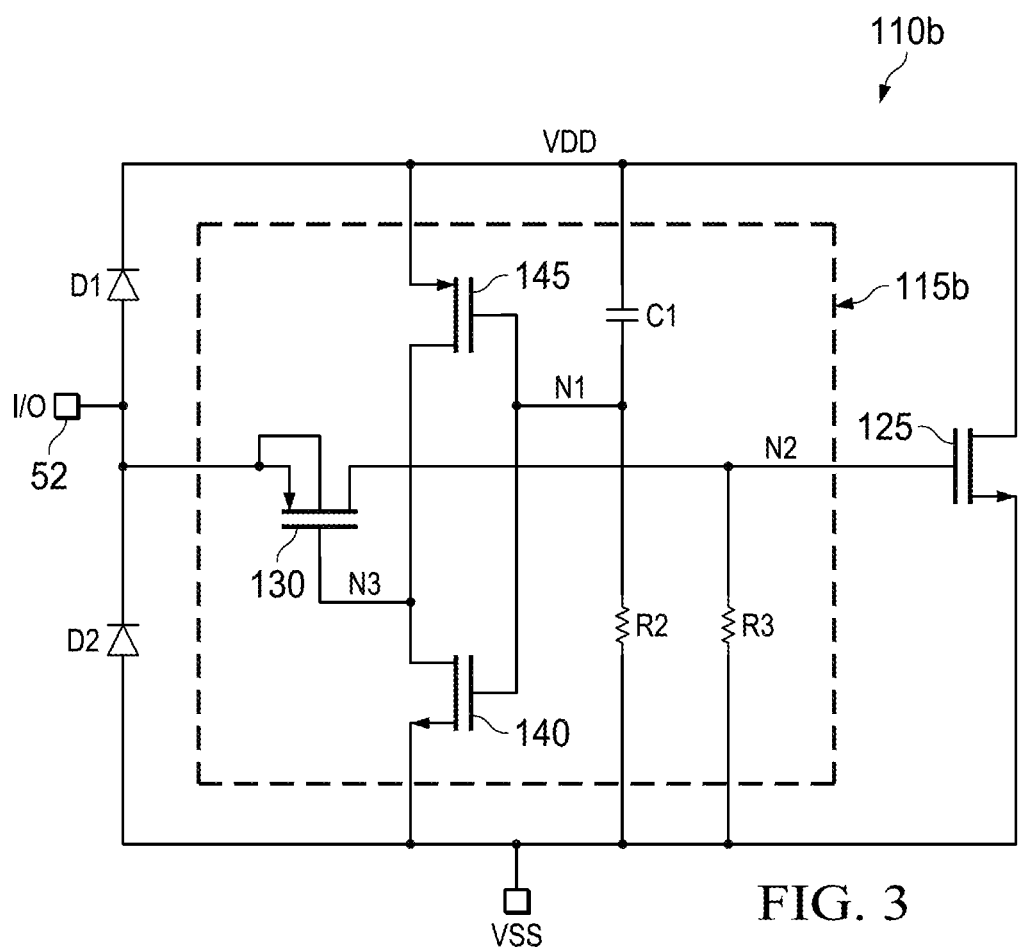
FIG. 3 shows another example of a triggering circuit which provides ESD protection for an I/O pad in accordance with various embodiments.

FIGS. 2 and 3 illustrate examples of the ESD protection circuit 110. Each ESD protection circuit 110 includes a different implementation of the trigger circuit 115. Accordingly, the ESD protection circuit of FIG. 2 is designated as ESD protection circuit 110a and its trigger circuit is designated as trigger circuit 115a. The ESD protection circuit of FIG. 3 is designated as ESD protection circuit 110b and its trigger circuit is designated as trigger circuit 115b. The ESD protection circuits of FIGS. 2 and 3 protect an I/O pad 52.

Referring now to the ESD protection circuit 110a of FIG. 2, diodes D1 and D2 are shown as in FIG. 1. The illustrative trigger circuit 115a includes a sensing transistor 130, a triggering transistor 140, resistors R1, R2, and R3 as well as capacitor C1. Capacitor C1 and resistor R2 are connected in series between VDD and VSS. The node N1 between the capacitor C1 and resistor R2 is connected to the gate of triggering transistor 140. The source of triggering transistor 140 (which may be implemented as a N-type Metal Oxide Semiconductor (NMOS) transistor) is connected to VSS and the drain of triggering transistor 140 connects both to the gate of the sensing transistor 130 (which may be a P-type Metal Oxide Semiconductor (NMOS) transistor) and to resistor R1 (at a node designated as N3). Resistor R1 may be a 50 Kohm resistor in some implementations but can be other than 50 Kohms as desired. The resistor R1 also connects to VDD. Resistor R3 (e.g., 200 Kohms) connects between node N2 and VSS (and node N2 is also connected to the gate of the active shunt transistor 125). Thus, while sensing transistor 130 is OFF, the gate of the active shunt transistor 125 is pulled low through resistor R3 thereby preventing the active shunt transistor 125 from turning ON. The active shunt transistor 125 in the example of FIG. 2 is implemented as an NMOS transistor. The source of sensing transistor 130 is connected to the I/O pad 52 and the drain of sensing transistor 130 is connected to the gate of active shunt transistor 125 (node N2).

In operation, VDD is a constant (DC) voltage and thus capacitor C1 appears as an open circuit. Thus, little or no current flows through the series combination of C1 and R2 from VDD to VSS. That being the case, there is no potential difference across resistor R2 and thus node N1 is at the VSS potential (i.e., low). With node N1 low, the gate of the triggering transistor 140 is low which causes triggering transistor 140 to be OFF. Because triggering transistor 140 is OFF, no current flows from VDD through resistor R1 and through the triggering transistor 140 to VSS. As such, the voltage on node N3 is at the VDD voltage (i.e., high) and thus the gate of the PMOS sensing transistor 130 is high thereby causing the sensing transistor 130 to be OFF. With sensing transistor 130 OFF and the gate of the active shunt transistor 125 being pulled low through resistor R3, the active shunt transistor 125 is OFF. As such, during normal operation (i.e., no ESD stress event), the active shunt transistor is OFF.

During an ESD stress event on the I/O pad 52, diode D1 turns on thereby providing additional current/voltage on the VDD rail. The fluctuation of the voltage on the VDD rail during an ESD stress event causes capacitor C1 to no longer be an open circuit. As such current conducts through capacitor C1 and through resistor R2 to VSS. As a result, a potential difference develops across resistor R2 on node N1 which, in turn, causes triggering transistor 140 to turn ON. With triggering transistor 140 in the ON state, current begins to flow from VDD through resistor R1 and triggering transistor 140 to VSS. Current through resistor R1 causes a potential difference to develop across resistor R1, which means that the voltage on node N3 will be low enough to turn ON the sensing transistor 130.

With sensing transistor 130 ON during an ESD stress event, the I/O pad 52 is connected to the gate of the active shunt transistor 125 with minimal voltage drop due to the source-to-drain voltage of the sensing transistor 130 (which may only be approximately 0.01V). Thus, the I/O pad voltage itself (less about 0.01V) drives the gate of the active shunt transistor. That voltage may be higher than might otherwise be the case in other ESD protection circuits. With the active shunt transistor 125 ON during an ESD stress event on the I/O pad 52, current is conducted from the I/O pad, through diode D1, the VDD rail and through the active shunt transistor to VSS.

Because the trigger circuit 115a provides a higher gate bias voltage to the active shunt transistor 125 than might otherwise be the case with other trigger circuits, the active shunt transistor can be implemented with a higher conductance. Higher conductance means the active shunt transistor 125 can be smaller for the same amount of ESD current. A smaller active shunt transistor 125 means the ESD protection circuit 110a for each I/O pin can be made smaller than would otherwise be the case. This is true for all of the trigger circuits described herein.

FIG. 3 illustrates another example of a trigger circuit 115b. In some respects trigger circuit 115b of FIG. 3 is similar to trigger circuit 115a of FIG. 2. As for trigger circuit 115a (FIG. 2), trigger circuit 115b (FIG. 3) includes sensing transistor 130, triggering transistor 140, capacitor C1 and resistors R2 and R3. A difference between the two trigger circuits is that resistor R1 of trigger circuit 115a has been replaced in trigger circuit 115b by transistor 145 (which may be a PMOS transistor). The combination of transistors 145 and 140 function as an inverter which causes node N3 to be of the opposite polarity as node N1 (the input to the inverter). During normal operation (no ESD stress event on the I/O pad 52), node N1 is low and the output of the inverter at node N3 is high which maintains the PMOS sensing transistor 130 in the OFF state. During an ESD stress event on the I/O pad 52, node N1 will become high and the output of the inverter at node N3 is forced low, which then causes the PMOS sensing transistor 130 into the ON state, which thereby turns on the active shunt transistor 125 and does so with very little voltage drop across the sensing transistor (approximately 0.01V).

Figure 4:
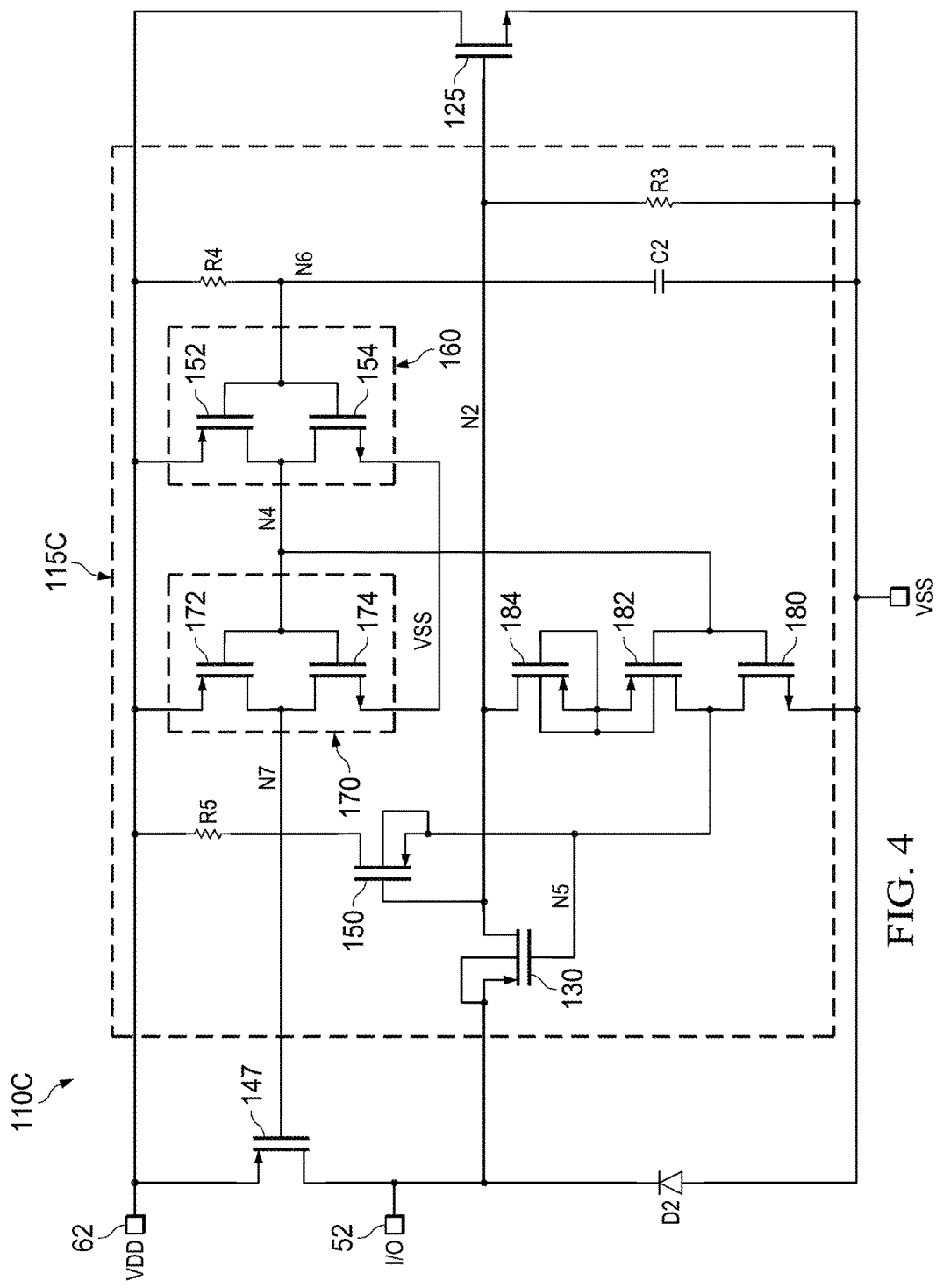
FIG. 4 shows an example of a triggering circuit which provides ESD protection for an I/O pad and a VDD pad by sharing a single active shunt transistor in accordance with various embodiments.

FIG. 4 shows an example of an ESD protection circuit 110c that provides ESD protection for both an I/O pad 52 and the VDD pad 62, and provides such protection by sharing a single active shunt transistor 125. The ESD protection circuit 110c of FIG. 4 includes a trigger circuit 115c. As with the previous trigger circuits 115a and 115b, trigger circuit 115c includes the active shunt transistor 125, the sensing transistor 130, the active, and resistor R3.

Diode D1 has been replaced by a transistor 147. The trigger circuit 115c includes a double inverter comprising inverter 160 and inverter 170. Inverter 160 includes transistors 152 and 154, and inverter 170 includes transistors 172 and 174. Node N6 is the input to the double inverter. Node N6 is the connection point between resistor R4 and capacitor C2. Resistor R4 is connected to VDD and capacitor C2 is connected to VSS, as shown. Node N4 is the output of the first inverter 160 which also is the input to the second inverter 170. Node N7 is the output of the second inverter 170. Node N7 (and thus the output of the second inverter 170) is connected to the gate of transistor 147 and controls the ON/OFF state of transistor 147.

Node N4 is the inverted form of the logic level on node N6. Thus, if node N6 is high, node N4 is low, and if node N6 is low, node N4 is high. Node N4 connects to the gates of transistors 180 and 182. In this example, transistor 180 is an NMOS transistor and transistor 182 is a PMOS transistor. Transistor 184 also is a PMOS transistor. The source of transistor 180 is connected to VSS.

The drains of transistors 180 and 182 are connected together and form node N5. The gate of the sensing transistor 130 also is connected to node N5. Resistor R5 is connected to VDD and to the drain of transistor 150 and the source of transistor 150 also is connected to node N5.

In the example of FIG. 4, the body connections of some transistors are shown, while the body connections of other transistors are not shown. The body connections that are not shown have been left off the schematic for simplicity. However, by default, the un-shown body connection for PMOS transistor is connected to VDD and the un-shown body connection for an NMOS transistor is connected to VSS.

During normal operations (no ESD stress event on either the I/O pad 52 or VDD pad 62), capacitor C2 appears as an open circuit thereby resulting in a HIGH (VDD) on node N6 which is the input to the first inverter 160. Node N4 is forced LOW due to the first inverter 160, and the second inverter 170 then causes node N7 to be HIGH. Node N7 being HIGH causes transistor 147 to be OFF. Further, node N4 being LOW causes transistor 180 to be OFF and transistor 182 to be ON.

Resistor R3 connects node N2 to VSS. Node N2 is also connected to the gate of transistor 150 which causes transistor 150 to be ON. With transistor 150 ON and with resistor R5 connected to VDD, node N5 is pulled high. Transistor 184 is OFF and prevents node N5 from being pulled down by R3. Node N5 being HIGH maintains sensing transistor 130 in the OFF state. With the sensing transistor 130 OFF and with the gate of the active shunt transistor 125 connected to ground through resistor R3, the gate of the active shunt transistor 125 is forced LOW thereby forcing the active shunt transistor to be OFF.

During an ESD stress event on the VDD pad 62, the capacitor C2 will begin to conduct current due to the fluctuating voltage on the VDD rail. Thus, current flows from VDD through resistor R4 thereby reducing the voltage on node N6 closer to VSS (LOW). Due to the inverters 160 and 170, node N4 is forced HIGH and node N7 is forced LOW. A LOW on node N7 causes transistor 147 to turn on essentially shorting the VDD and I/O pads 62, 52 together. The HIGH on node N4 causes transistor 180 to turn ON which, in turn, forces node N5 to be LOW. Node N5 being low causes sensing transistor 130 to turn ON. Transistor 182 is OFF and prevents node N2 from being pulled down by transistor 180. With sensing transistor 130 ON as well as transistor 147, the voltage on the VDD pad 62 is effectively provided to the gate of the active shunt transistor 125 on node N2. The voltage provided to the gate of the active shunt transistor 125 is the VDD pad voltage minus relatively small source-to-drain voltage drops across transistors 147 and 130.

The operation of the trigger circuit during an ESD stress event on the I/O pad 52 is similar to that described above. Transistor 147 is a PMOS transistor and, as noted above, has its body connection connected to VDD. This means that transistor 147 operates as a diode (analogous to diode D1 in FIGS. 2 and 3). An ESD stress event on I/O pad causes the "diode" of transistor 147 to turn on which causes ESD voltage to be superimposed on the VDD rail. At this point, the trigger circuit 115*c* operates the same as described above with respect to an ESD stress event on the I/O pad. As such, a single active shunt transistor can be caused to be ON to shunt current from either or both of the I/O pad 52 and the VDD pad 62 during an ESD stress event on either pad.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electrostatic discharge (ESD) protection circuit, comprising:
    a high power supply rail (VDD) and a low power supply rail (VSS);
    an active shunt transistor coupled between VDD and VSS, the active shunt transistor including a gate;
    a sensing transistor connected between an input/output (I/O) pad and the gate of the active shunt transistor; and
    a triggering transistor connected to a gate of the sensing transistor and, upon occurrence of an ESD stress event on the I/O pad, the triggering transistor is to turn ON thereby causing the sensing transistor to turn ON;
    wherein, if the ESD stress event occurs on the I/O pad or on a VDD pad, the sensing transistor is caused to be turned ON thereby permitting a voltage on the I/O or VDD pad experiencing the ESD stress event to turn ON the active shunt transistor in turn causing ESD current to flow from the pad experiencing the ESD event, through VDD, and through the active shunt transistor to VSS.

2. The ESD protection circuit of claim 1 wherein the sensing transistor is caused to be turned ON thereby turning on the active shunt transistor if the ESD stress event occurs on the I/O pad and wherein the sensing transistor is caused to be turned ON thereby turning ON the active shunt transistor if the ESD stress event occurs on the VDD pad.

3. The ESD protection circuit of claim 1 further comprising a diode connected between the I/O pad and VSS and a P-type Metal Oxide Semiconductor (PMOS) transistor connected between the I/O pad and VDD with a body connection of said transistor connected to VDD.

4. An integrated circuit (IC), comprising:
    host logic;
    a plurality of input/output (I/O) pads connected to the host logic and providing input and output connections for the host logic;
    for each I/O pad, an electrostatic discharge (ESD) protection circuit that includes a high power supply rail (VDD) and a low power supply rail (VSS), an active shunt transistor coupled between VDD and VSS, the active shunt transistor including a gate, and a sensing transistor connected between the corresponding I/O pad and the gate of the active shunt transistor, and wherein, if an ESD stress event occurs on the I/O pad, the sensing transistor is caused to be turned ON thereby permitting a voltage on the I/O pad to turn ON the active shunt transistor in turn causing ESD current to flow from VDD through the active shunt transistor to VSS; and
    for the ESD protection circuit of each I/O pad, a triggering transistor connected to a gate of the sensing transistor and, upon occurrence of the ESD stress event on the I/O pad, the triggering transistor is to turn ON thereby causing the sensing transistor to turn ON.

5. The IC of claim 4 wherein, for at least one of the ESD protection circuits, the sensing transistor in that ESD protection circuit is caused to be turned ON thereby turning ON the active shunt transistor if the ESD stress event occurs on a VDD pad.

6. The IC of claim 5 further comprising, for the at least one ESD protection circuit, a triggering transistor connected to a gate of the sensing transistor and, upon occurrence of the ESD stress event on the either the I/O or VDD pads, the triggering transistor is to turn ON thereby causing the sensing transistor to turn ON.

7. The IC of claim 4 further comprising, for each ESD protection circuit, a diode connected between the I/O pad and VSS and a P-type Metal Oxide Semiconductor (PMOS) transistor connected between the I/O pad and VDD with a body connection of said transistor connected to VDD.

8. An electrostatic discharge (ESD) protection circuit, comprising:
    a high power supply rail (VDD) and a low power supply rail (VSS);
    an active shunt transistor coupled between VDD and VSS, the active shunt transistor including a gate;
    a sensing transistor connected between an input/output (I/O) pad and the gate of the active shunt transistor; and
    a triggering transistor connected to a gate of the sensing transistor and, upon occurrence of an ESD stress event, the triggering transistor is to turn ON thereby causing the sensing transistor to turn ON to cause the active shunt transistor to turn ON;
    wherein, if an ESD stress event occurs on the I/O pad, the sensing transistor is caused to be turned ON thereby causing a voltage on the I/O pad experiencing the ESD stress event to turn ON the active shunt transistor in turn causing ESD current to flow from the pad experiencing the ESD event, through VDD, and through the active shunt transistor to VSS; and
    wherein, if the ESD stress event occurs on a VDD pad, the sensing transistor is caused to be turned ON thereby causing a voltage on the VDD pad experiencing the ESD stress event to turn ON the active shunt transistor in turn causing ESD current to flow from the VDD pad through the active shunt transistor to VSS.

\* \* \* \* \*